(12) United States Patent
Han et al.

(10) Patent No.: US 11,641,756 B2
(45) Date of Patent: May 2, 2023

(54) DISPLAY DEVICE WITH ENHANCED DAMAGE RESISTANCE AND METHOD FOR MANUFACTURING THE SAME

(71) Applicant: LG DISPLAY CO., LTD., Seoul (KR)

(72) Inventors: GyuHyeong Han, Seoul (KR); Heechul Lim, Paju-si (KR); ByoungChul Kim, Paju-si (KR); Heesung Park, Busan (KR)

(73) Assignee: LG DISPLAY CO., LTD., Seoul (KR)

( * ) Notice: Subject to any disclaimer, the term of this patent is extended or adjusted under 35 U.S.C. 154(b) by 71 days.

(21) Appl. No.: 17/330,938

(22) Filed: May 26, 2021

(65) Prior Publication Data

US 2021/0280820 A1      Sep. 9, 2021

Related U.S. Application Data

(62) Division of application No. 15/824,681, filed on Nov. 28, 2017, now Pat. No. 11,050,038.

(30) Foreign Application Priority Data

Dec. 28, 2016  (KR) .......................... 10-2016-0180912

(51) Int. Cl.
*H10K 50/842*      (2023.01)
*H01L 27/12*       (2006.01)

(52) U.S. Cl.
CPC ..... *H10K 50/8426* (2023.02); *H01L 27/1218* (2013.01); *H01L 27/1248* (2013.01); *H01L 27/1255* (2013.01); *H01L 27/1262* (2013.01); *H10K 50/824* (2023.02); *H10K 59/10* (2023.02); *H10K 59/121* (2023.02); *H10K 50/828* (2023.02); *H10K 59/12* (2023.02); *H10K 71/00* (2023.02)

(58) Field of Classification Search
CPC ........................................ H01L 27/1214–3293
See application file for complete search history.

(56) References Cited

U.S. PATENT DOCUMENTS 8,084,772 B2    12/2011  Eom et al.
2014/0117336 A1  5/2014  Kim et al.
(Continued)

FOREIGN PATENT DOCUMENTS

| CN | 1638569 A | 7/2005 |
| KR | 10-2014-0136737 A | 12/2014 |
| KR | 10-2015-0018075 A | 2/2015 |

OTHER PUBLICATIONS

Kwon et al., KR 10-2016-0094481, published Aug. 10, 2016.*
Machine translation of KR 10-2016-0094481.*
Human translation of Kwon et al., KR 10-2016-0094481, 2016.*

*Primary Examiner* — Suberr L Chi
(74) *Attorney, Agent, or Firm* — Birch, Stewart, Kolasch & Birch, LLP

(57) ABSTRACT

A display device and a method for manufacturing the same are disclosed, in which a cathode electrode is not separated from an organic light emitting layer. The method includes forming pixels on a display area on a first substrate, forming an encapsulation film to cover the display area, attaching a protective film onto the encapsulation film, and removing the protective film. The protective film includes a substrate layer and an adhesive layer formed at an edge area of at least one side of the substrate layer.

7 Claims, 10 Drawing Sheets

(56) References Cited

U.S. PATENT DOCUMENTS

| | | |
|---|---|---|
| 2014/0246665 A1 | 9/2014 | Lang et al. |
| 2014/0346445 A1 | 11/2014 | Cho |
| 2016/0226021 A1 | 8/2016 | Lee et al. |
| 2017/0338250 A1* | 11/2017 | Yanaka ................ H01L 27/124 |

* cited by examiner

DISPLAY DEVICE WITH ENHANCED DAMAGE RESISTANCE AND METHOD FOR MANUFACTURING THE SAME

CROSS REFERENCE TO RELATED APPLICATIONS

This application is a Divisional of copending U.S. patent application Ser. No. 15/824,681, filed on Nov. 28, 2017, which claims priority under 35 U.S.C. § 119(a) to Korean Patent Application No. 10-2016-0180912 filed on Dec. 28, 2016, all of these applications are hereby expressly incorporated by reference into the present application.

BACKGROUND OF THE INVENTION

Field of the Invention

The present invention relates to a display device and a method for manufacturing the same.

Discussion of the Related Art

With the advancement of the information age, a demand for a display device for displaying an image has been increased in various forms. Therefore, various display devices such as liquid crystal display (LCD) devices, plasma display panel (PDP) devices, and organic light emitting display (OLED) devices have been used.

Among the display devices, the organic light emitting display device is a self-light emitting device, and has advantages in that a viewing angle and a contrast ratio are more excellent than those of the liquid crystal display device. Also, since the organic light emitting display device does not require a separate backlight, it is advantages that the organic light emitting display device is able to be thin and light-weight and has low power consumption. Furthermore, the organic light emitting display device has advantages in that it may be driven at a low direct current voltage, has a fast response speed, and especially has a low manufacturing cost.

The organic light emitting display device includes pixels, each of which includes an organic light emitting diode, and a bank partitioning the pixels to define the pixels. The bank may serve as a pixel definition film. The organic light emitting diode includes an anode electrode, a hole transporting layer, an organic light emitting layer, an electron transporting layer, and a cathode electrode. In this case, if a high potential voltage is applied to the anode electrode and a low potential voltage is applied to the cathode electrode, holes and electrons are moved to the organic light emitting layer through the hole transporting layer and the electron transporting layer, respectively, and are combined with each other in the organic light emitting layer to emit light.

The organic light emitting diode has a problem in that the organic light emitting diode is likely to be degraded due to external factors such as external $H_2O$ and $O_2$. To prevent such a problem from occurring, the organic light emitting device includes an encapsulation film formed to prevent external $H_2O$ and $O_2$ from being permeated into the organic light emitting diode.

FIG. 1 is a cross-sectional view briefly illustrating a display device of a related art.

Referring to FIG. 1, in the display device of the related art, an encapsulation layer 30 is formed on a substrate 10 provided with an organic light emitting diode layer 20. At this time, the encapsulation layer 30 prevents $O_2$ or $H_2O$ from being permeated into the organic light emitting layer 20 and an electrode.

It is general that processes for manufacturing a display device are not performed continuously. For example, the organic light emitting diode layer 20 and the encapsulation layer 30 may be formed on the first substrate 10 through a continuous process. Then, the substrate 10 provided with the organic light emitting diode layer 20 and the encapsulation layer 30 may move to perform a later process. At this time, to prevent the organic light emitting diode layer 20 and the encapsulation layer 30 from being damaged, the first substrate 10 moves to a place where a later process is performed in a state that a protective film 40 is attached thereto as shown in FIG. 1. Then, the later process is performed after the protective film 40 is removed from the first substrate 10.

The protective film 40 includes a substrate layer 42 and an adhesive layer 44. The adhesive layer 44 is deposited on the entire surface of the substrate layer 42 to cover an entire surface of the encapsulation layer 30. At this time, the adhesion between the encapsulation layer 30 and the adhesive layer 44 is greater than that between an organic light emitting layer of the organic light emitting diode layer 20 and the cathode electrode, a problem occurs in that the cathode electrode is separated from the organic light emitting layer when the protective film 40 is removed from the first substrate 10. Since light is not emitted normally in an area where the cathode electrode is separated from the organic light emitting layer, a defect of the display device occurs.

SUMMARY OF THE INVENTION

Accordingly, the present invention is directed to a display device and a method for manufacturing the same, which substantially obviate one or more problems due to limitations and disadvantages of the related art.

An advantage of the present invention is to provide a display device and a method for manufacturing the same, in which a cathode electrode is not separated from an organic light emitting layer.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for manufacturing a display device according to one embodiment of the present invention comprises the steps of forming pixels on a display area on a first substrate; forming an encapsulation film to cover the display area; attaching a protective film onto the encapsulation film; and removing the protective film. At this time, the protective film includes a substrate layer and a first adhesive layer formed at an edge area of at least one side of the substrate layer.

In another aspect of the present invention, a display device according to another embodiment of the present invention comprises a substrate including a display area on which pixels are arranged, and a non-display area surrounding the display area; and a protective film adhered onto the substrate. At this time, the protective film includes a substrate layer and a first adhesive layer formed at an edge area of at least one side of the substrate layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1:
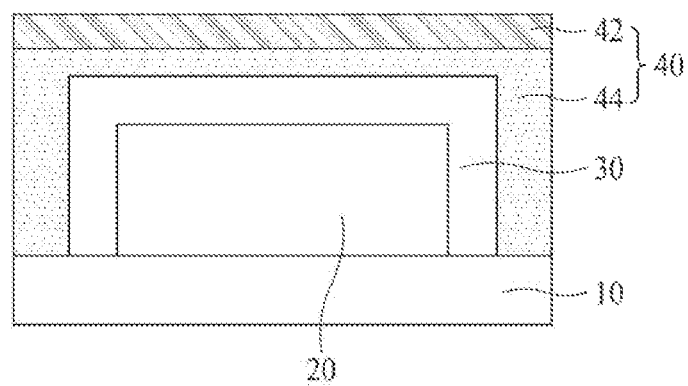
FIG. 1 is a cross-sectional view briefly illustrating a display device of the related art.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout the specification. In the following description, when the detailed description of the relevant known function or configuration is determined to unnecessarily obscure the important point of the present invention, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another element. For example, a first element could be termed a second element, and, similarly, a second element could be termed a first element, without departing from the scope of the present invention.

Further, "X-axis direction", "Y-axis direction" and "Z-axis direction" should not be construed by a geometric relation only of a mutual vertical relation, and may have broader directionality within the range that elements of the present invention may act functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item. Also the term "may" fully encompasses all the meanings of the term "can".

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, the preferred embodiments of the present invention will be described in detail with reference to the accompanying drawings.

Figure 2:
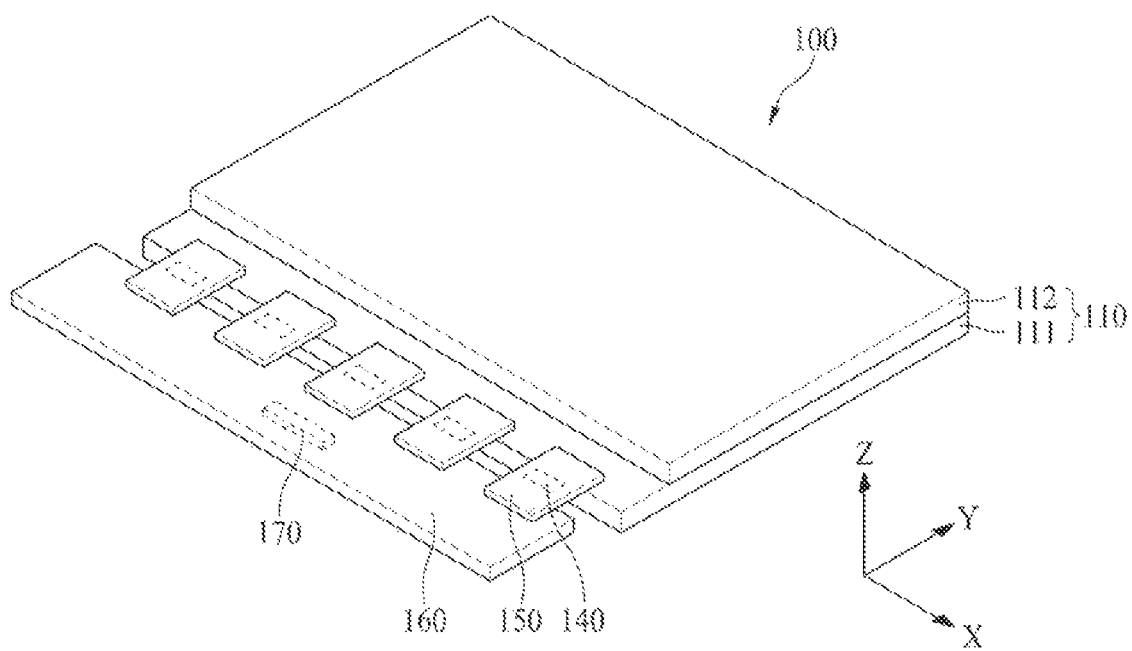
FIG. 2 is a perspective view illustrating a display device according to one embodiment of the present invention.
Figure 3:
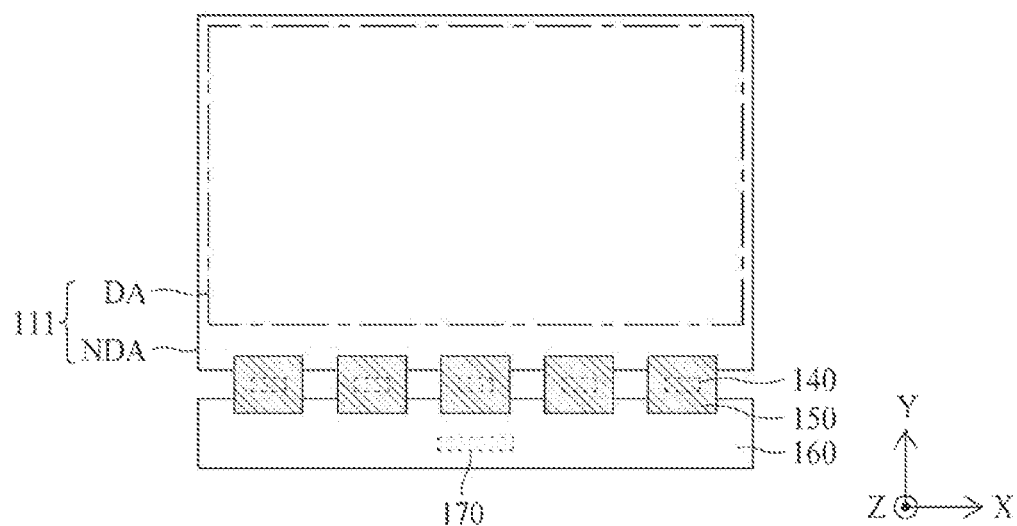
FIG. 3 is a plane view illustrating a first substrate, a source drive IC, a flexible film, a circuit board, and a timing controller of FIG. 2.

FIG. 2 is a perspective view illustrating a display device 100 according to one embodiment of the present invention, and FIG. 3 is a plane view illustrating a first substrate, a source drive IC, a flexible film, a circuit board, and a timing controller of FIG. 2. Hereinafter, the display device according to one embodiment of the present invention, which will be described, is, but not limited to, an organic light emitting display device. That is, the display device according to one embodiment of the present invention may be realized as any one of a liquid crystal display device, a field emission display device and an electrophoresis display device. Further all components of the display device according to all embodiments of the present invention are operatively coupled and configured.

Referring to FIGS. 2 and 3, the display device 100 according to one embodiment of the present invention includes a display panel 110, a source drive integrated circuit (IC) 140, a flexible film 150, a circuit board 160, and a timing controller 170.

The display panel 110 includes a first substrate 111 and a second substrate 112. The second substrate 112 may be an encapsulation substrate. The first substrate 111 may be a plastic film or a glass substrate. The second substrate 112 may be a plastic film, a glass substrate, or an encapsulation film.

Gate lines, data lines and pixels are formed on one surface of the first substrate 111, which faces the second substrate 112. The pixels are provided in an area defined by a crossing structure of the gate lines and the data lines.

Each of the pixels may include an organic light emitting diode that includes a thin film transistor, a first electrode, an organic light emitting layer, and a second electrode. Each of the pixels supplies a predetermined current to the organic light emitting diode in accordance with a data voltage of the data line if a gate signal is input from the gate line by using the thin film transistor. For this reason, the organic light emitting diode of each of the pixels may emit light with a predetermined brightness in accordance with the predetermined current. A structure of each of the pixels will be described later with reference to FIGS. 5 and 6.

The display panel 110 may be categorized into a display area DA where the pixels are formed to display an image and a non-display area NDA where an image is not displayed, as shown in FIG. 3. The gate lines, the data lines and the pixels may be formed on the display area DA. A gate driver and pads may be formed on the non-display area NDA.

The gate driver supplies gate signals to the gate lines in accordance with a gate control signal input from the timing controller 170. The gate driver 20 may be formed on the non-display area NDA outside one side or both sides of the display area DA of the display panel 110 in a gate driver in panel (GIP) mode. Alternatively, the gate driver may be fabricated of a driving chip, packaged in a flexible film and attached to the non-display area NDA outside one side or both sides of the display panel 110 in a tape automated bonding (TAB) mode.

The source drive IC 140 receives digital video data and a source control signal from the timing controller 170. The source drive IC 140 converts the digital video data to analog data voltages in accordance with the source control signal and supplies the analog data voltages to the data lines. If the source drive IC 140 is fabricated of a driving chip, the source drive IC 140 may be packaged in the flexible film 150 in a chip on film (COF) or chip on plastic (COP) mode.

Pads such as data pads may be formed on the non-display area NDA of the display panel 110. Lines which connect the pads with the source drive IC 140 and lines which connect the pads with lines of the circuit board 160 may be formed in the flexible film 150. The flexible film 150 may be attached onto the pads by an anisotropic conducting film, whereby the pads may be connected with the lines of the flexible film 150.

The circuit board 160 may be attached to the flexible films 150. A plurality of circuits comprised of driving chips may be packaged in the circuit board 160. For example, the timing controller 170 may be packaged in the circuit board 160. The circuit board 160 may be a printed circuit board or a flexible printed circuit board.

The timing controller 170 receives digital video data and a timing signal from an external system board through a cable. The timing controller 170 generates a gate control signal for controlling an operation timing of the gate driver and a source control signal for controlling the source drive ICs 140 on the basis of the timing signal. The timing controller 170 supplies the gate control signal to the gate driver, and supplies the source control signal to the source drive ICs 140.

First Embodiment

Figure 4:
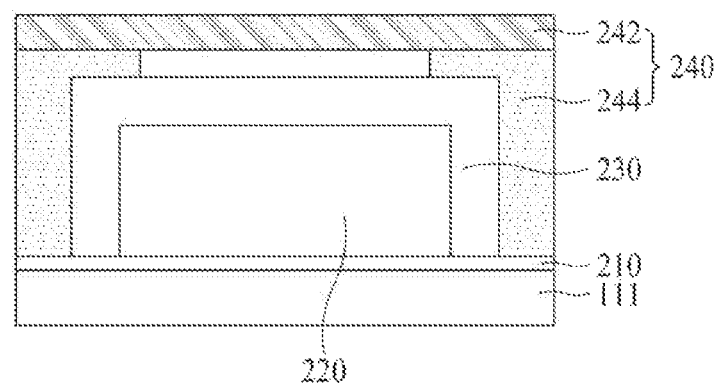
FIG. 4 is a cross-sectional view briefly illustrating a first substrate according to a first embodiment of the present invention.

FIG. 4 is a cross-sectional view briefly illustrating an example of a display device including a first substrate 111 according to the first embodiment of the present invention.

The first substrate 111 for moving to a place where a later process is performed before being bonded to a second substrate 112 is shown in FIG. 4. The first substrate 111 according to one embodiment of the present invention is provided with a thin film transistor layer 210, an organic light emitting diode layer 220, an encapsulation layer 230, and a protective film 240, which are formed on one surface.

The first substrate 111 may be a plastic film or a glass substrate.

The thin film transistor layer 210 is formed on the first substrate 111. The thin film transistor layer 210 may include scan lines, data lines, and thin film transistors. Each of the thin film transistors includes a gate electrode, a semiconductor layer, and source and drain electrodes.

The organic light emitting diode layer 220 is formed on the thin film transistor layer 210. The organic light emitting diode layer 220 includes first electrodes, organic light emitting layers, second electrodes, and banks. Each of the organic light emitting layers may include a hole transporting layer, an organic light emitting layer, and an electron transporting layer. In this case, if a voltage is applied to each of the second electrode and the first electrode, holes and electrons are moved to the light emitting layer through the hole transporting layer and the electron transporting layer, respectively, and are combined with each other in the light emitting layer to emit light. Since the pixels are provided in the area where the organic light emitting diode layer 220 is formed, the area where the organic light emitting diode layer 220 is formed may be defined as the display area. A peripheral area of the display area may be defined as the non-display area.

The encapsulation layer 230 is formed on the organic light emitting diode layer 220. The encapsulation layer 230 serves to prevent $O_2$ or $H_2O$ from being permeated into the organic light emitting diode layer 220. The encapsulation layer 230 may include at least one inorganic film.

A protective film 240 is formed on the encapsulation layer 230. The protective film 240 includes a substrate layer 242 and an adhesive layer 244. The protective film 240 serves to prevent particles from being permeated into the thin film transistor layer 210, the organic light emitting diode layer 220 and the encapsulation layer 230 formed on the first substrate 111 or prevent the thin film transistor layer 210, the organic light emitting diode layer 220 and the encapsulation layer 230 from being damaged while the first substrate 111 is moving to perform the later process. The protective film 240 is attached onto the encapsulation layer 230 before the first substrate 111 moves to the place where the later process is performed, and then is separated from the encapsulation layer 230 before the later process is performed.

Hereinafter, a structure of the protective film 240 according to the first embodiment of the present invention will be described with reference to FIGS. 5 to 14.

Figure 5:
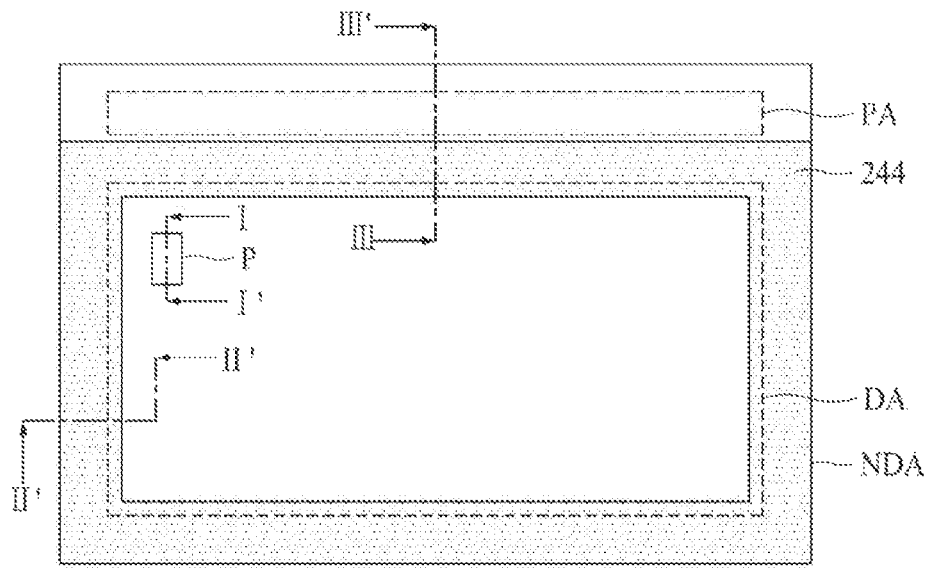
FIG. 5 is a plane view briefly illustrating a first substrate according to the first embodiment of the present invention.

FIG. 5 is a plane view briefly illustrating the first substrate 111 according to the first embodiment of the present invention.

Referring to FIG. 5, the first substrate 111 is categorized into the display area DA and the non-display area NDA, wherein a pad area PA where pads are formed may be formed on the non-display area NDA.

Pixels P for displaying an image are formed on the display area DA. Each of the pixels may include an organic light emitting diode that includes a thin film transistor, a first electrode, an organic light emitting layer, and a second electrode. Each of the pixels supplies a predetermined current to the organic light emitting diode in accordance with the data voltage of the data line if the gate signal is input from the gate line by using the thin film transistor. For this reason, the organic light emitting diode of each of the pixels may emit light with a predetermined brightness in accordance with the predetermined current.

Hereinafter, a structure of each of the pixels P of the display area DA according to the embodiments of the present invention will be described in detail with reference to FIG. 6.

Figure 6:
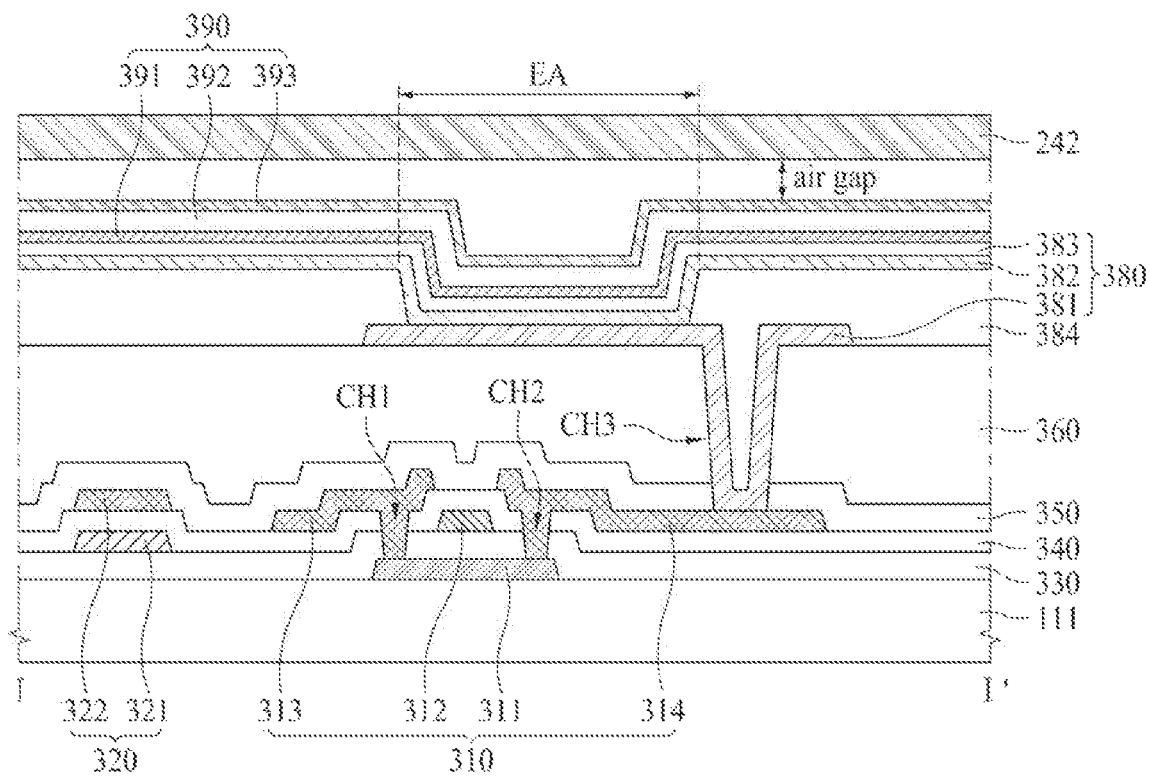
FIG. 6 is a cross-sectional view illustrating an example of a pixel of a display area of FIG. 5, taken along line I-I' in FIG. 5.

FIG. 6 is a cross-sectional view cut along line I-I' of FIG. 5, for illustrating an example of the pixel of the display area of FIG. 5.

Referring to FIG. 6, the thin film transistor layer 210 is formed on one surface of the first substrate 111. At this time, the thin film transistor layer 210 includes thin film transistors 310 and capacitors 320.

In more detail, a buffer film may be formed on the first substrate 111 to protect the thin film transistors 310 from H$_2$O permeated through the first substrate 111 which is vulnerable to moisture permeability.

Each of the thin film transistors 310 includes an active layer 311, a gate electrode 312, a source electrode 313, and a drain electrode 314. Although the thin film transistors 310 are formed in a top gate mode in such a manner that the gate electrode 312 is arranged above the active layer 311 as shown in FIG. 6, it is to be understood that the thin film transistors of the present invention are not limited to the top gate mode. That is, the thin film transistors 310 may be formed in a bottom gate mode in which the gate electrode 312 is arranged below the active layer 311 or a double gate mode in which the gate electrode 312 is arranged above and below the active layer 311.

The active layer 311 is formed on the buffer film of the first substrate 110. The active layer 311 may be formed of a silicon based semiconductor material or an oxide based semiconductor material. A light-shielding layer for shielding external light entering the active layer 311 may be formed on the first substrate 110.

A gate insulating film 330 may be formed on the active layer 311. The gate insulating film 330 may be formed of an inorganic film, for example, a silicon oxide film, a silicon nitride film or a multi-layered film of the silicon oxide film and the silicon nitride film.

The gate electrode 312 may be formed on the gate insulating film 330. The gate electrode 312 may be, but not limited to, a single layer or multi-layer comprised of any one of Mo, Al, Cr, Au, Ti, Ni, Nd and Cu or their alloy.

An inter-layer dielectric layer 340 may be formed on the gate electrode 312. The inter-layer dielectric layer 340 may be formed of an inorganic film, for example, a silicon oxide film, a silicon nitride film, or a multi-layered film of the silicon oxide film and the silicon nitride film.

The source electrode 313 and the drain electrode 314 may be formed on the inter-layer dielectric layer 340. Each of the source electrode 313 and the drain electrode 314 may be connected to the active layer 311 through contact holes CH1 and CH2 that pass through the gate insulating film 330 and the inter-layer dielectric layer 340. Each of the source electrode 313 and the drain electrode 314 may be, but not limited to, a single layer or multi-layer comprised of any one of Mo, Al, Cr, Au, Ti, Ni, Nd and Cu or their alloy.

Each of the capacitors 320 includes a lower electrode 321 and an upper electrode 322. The lower electrode 321 is formed on the gate insulating film 330, and may be formed of the same material as that of the gate electrode 312. The upper electrode 322 is formed on the inter-layer dielectric layer 340, and may be formed of the same material as that of the source electrode 313 and the drain electrode 324.

A passivation film 350 may be formed on the thin film transistor 310 and the capacitor 320. The passivation film 350 may serve as an insulating film. The passivation film 350 may be formed of an inorganic film, for example, a silicon oxide film, a silicon nitride film, or a multi-layered film of the silicon oxide film and the silicon nitride film.

The organic light emitting diode layer 220 is formed on the thin film transistor layer 210. At this time, the organic light emitting diode layer 220 includes an organic light emitting diode 380.

In more detail, a planarization film 360 for planarizing a step difference due to the thin film transistor 310 and the capacitor 320 may be formed on the passivation film 350. The planarization film 360 may be formed of an organic film such as acrylic resin, epoxy resin, phenolic resin, polyamide resin, and polyimide resin.

The organic light emitting diode 380 and a bank 384 are formed on the planarization film 360. The organic light emitting diode 380 includes a first electrode 381, an organic light emitting layer 382, and a second electrode 383. The first electrode 381 may be an anode electrode, and the second electrode 383 may be a cathode electrode. An area where the first electrode 381, the organic light emitting layer 382 and the second electrode 383 are deposited may be defined as an emission area (EA).

The first electrode 381 may be formed on the planarization film 360. The first electrode 381 is connected to the drain electrode 314 of the thin film transistor 310 through a contact hole CH3 that passes through the passivation film 350 and the planarization film 360. The first electrode 381 may be formed of a metal material having high reflectivity such as a deposition structure (Ti/Al/Ti) of Al and Ti, a deposition structure (ITO/Al/ITO) of Al and ITO, an APC alloy, and a deposition structure (ITO/APC/ITO) of APC alloy and ITO. The APC alloy is an alloy of Ag, Pd and Cu.

The bank 384 may be formed on the planarization film 360 to cover an edge of the first electrode 381, thereby partitioning the emission areas EA. The bank 384 may be formed of an organic film such as acrylic resin, epoxy resin, phenolic resin, polyamide resin, and polyimide resin.

The organic light emitting layer 382 is formed on the first electrode 381 and the bank 384. The organic light emitting layer 382 may include a hole transporting layer, at least one light emitting layer, and an electron transporting layer. In this case, if a voltage is applied to the first electrode 381 and the second electrode 383, holes and electrons are moved to the light emitting layer through the hole transporting layer and the electron transporting layer, respectively, and are combined with each other in the light emitting layer to emit light.

The organic light emitting layer 382 may be comprised of a white light emitting layer emitting white light. In this case, the organic light emitting layer 382 may be formed to cover the first electrode 381 and the bank 384. In this case, a color filter may be formed on the second substrate 112.

Alternatively, the organic light emitting layer 382 may be comprised of a red light emitting layer emitting red light, a green light emitting layer emitting green light, or a blue light emitting layer emitting blue light. In this case, the organic light emitting layer 382 may be formed in an area corresponding to the first electrode 381, and a color filter may not be formed on the second substrate 112.

The second electrode 383 is formed on the organic light emitting layer 382. If the organic light emitting display device is formed in a top emission structure, the second electrode 383 may be formed of a transparent conductive material (TCO) such as ITO and IZO, which may transmit light, or a semi-transmissive conductive material such as Mg, Ag, or alloy of Mg and Ag. A capping layer may be formed on the second electrode 383.

An encapsulation layer 230 is formed on the organic light emitting diode layer 220. At this time, the encapsulation layer 230 includes an encapsulation film 390.

In more detail, the encapsulation film 390 is formed on the organic light emitting diode 380. The encapsulation film 390 serves to prevent $H_2O$ or $O_2$ from being permeated into the organic light emitting layer 382 and the second electrode 383. To this end, the encapsulation film 390 may include at least one inorganic film and at least one organic film.

For example, the encapsulation film 390 may include a first inorganic film 391, a first organic film 392, and a second inorganic film 393. In this case, the first inorganic film 391 is formed to cover the second electrode 383. The first organic film 392 is formed on the first inorganic film 391. The first organic film 392 is preferably formed at a sufficient thickness to prevent particles from being permeated into the organic light emitting layer 382 and the second electrode 383 by passing through the first inorganic film 391. The second inorganic film 393 is formed to cover the first organic film 392.

A protective film 240 is formed on the encapsulation film 390. The protective film 240 includes a substrate layer 242 and an adhesive layer 244. The substrate layer 242 is only formed on the encapsulation film 390 arranged in the pixel P. An air gap is formed between the encapsulation film 390 and the substrate layer 242. Therefore, the encapsulation film 390 and the substrate layer 242 are not adhered to each other in the area where the pixels P are arranged, and their adhesion is close to 0 gf/inch.

Referring to FIG. 5 again, the pad area PA may be arranged at an edge of one side of the first substrate 111. The pad area PA includes a plurality of pads, which may electrically be connected with lines of the flexible film 150 by using an anisotropic conducting film.

Figure 9:
FIG. 9 is a plane view illustrating a modified embodiment of FIG. 5.
Figure 10:
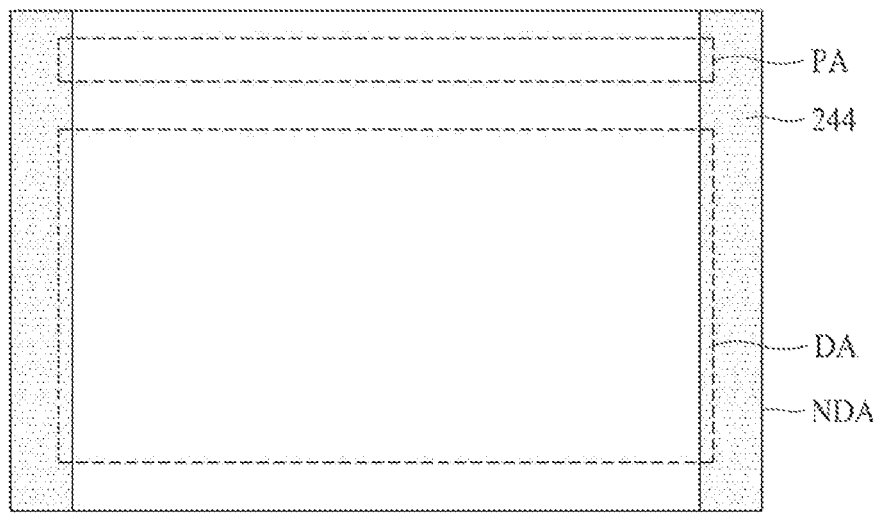
FIG. 10 is a plane view illustrating another modified embodiment of FIG. 5.

The protective film 240 is adhered on the display area DA and the non-display area NDA. At this time, the protective film 240 may not be formed on the pad area PA as shown in FIG. 5. However, the present invention is not limited to the example of FIG. 5. In another embodiment, the protective film 240 may be formed even on the pad area PA as shown in FIGS. 9 and 10.

The protective film 240 includes the substrate layer 242 and the adhesive layer 244. The first embodiment of the present invention is characterized in that the adhesive layer 244 is formed on the edge area of the substrate layer 242 but is not formed at the center area of the substrate layer 242.

Hereinafter, the protective film 240 according to the first embodiment of the present invention will be described in more detail with reference to FIGS. 7 and 8.

Figure 7:
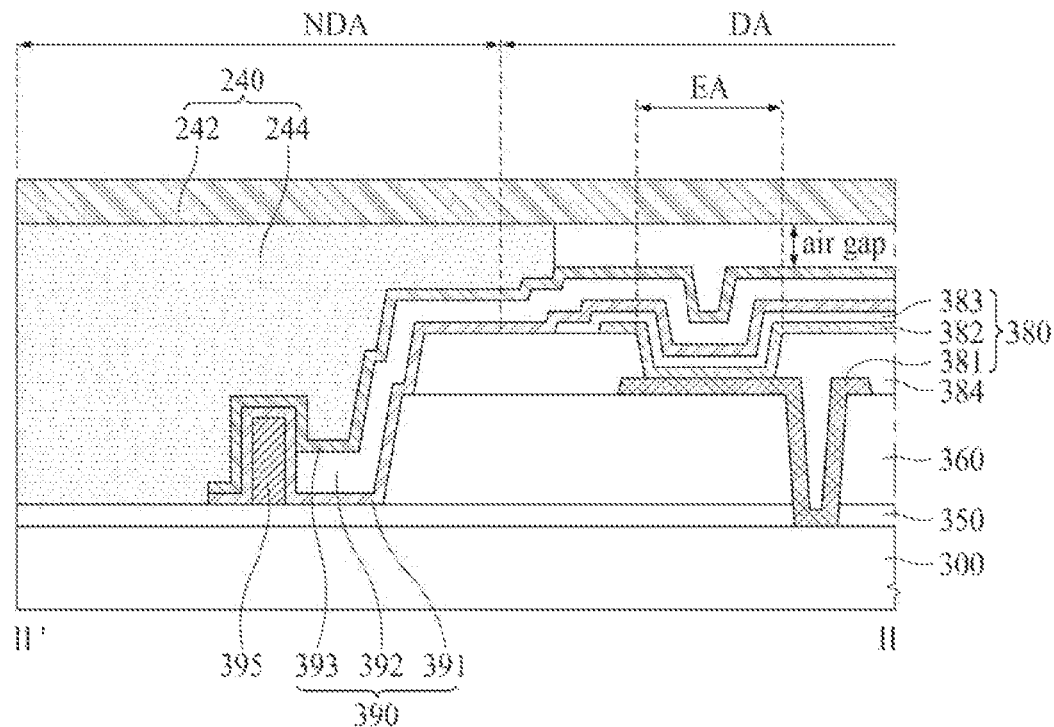
FIG. 7 is a cross-sectional view taken along line II-II' shown in FIG. 5.
Figure 8:
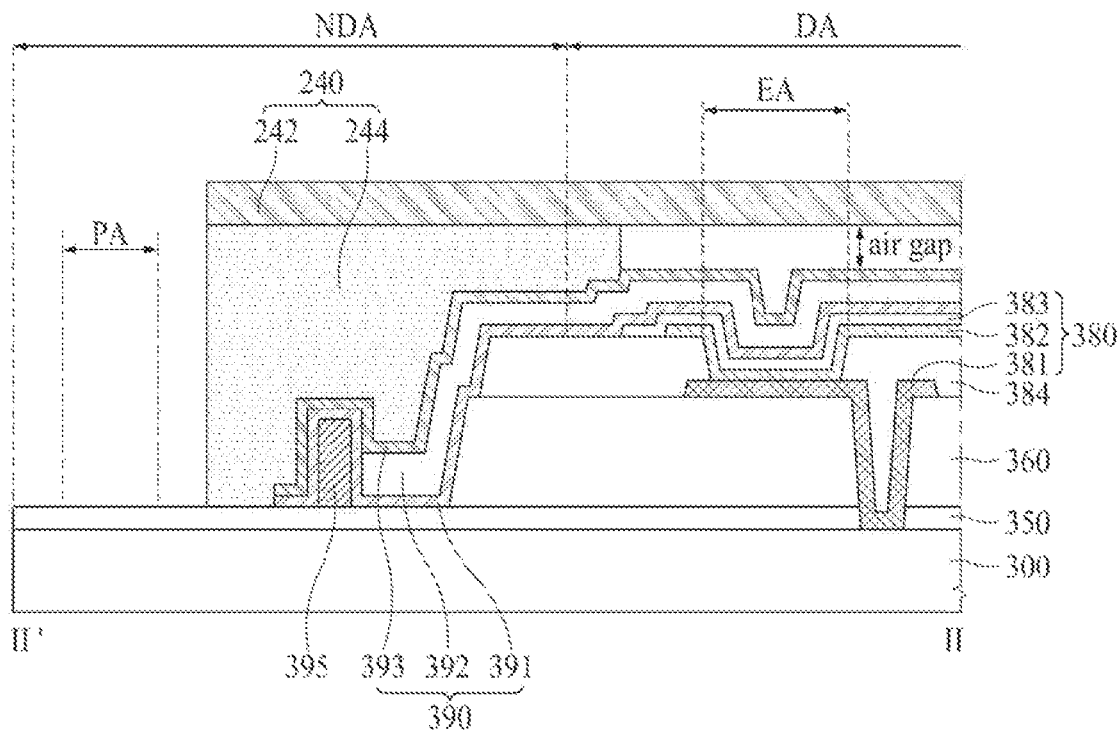
FIG. 8 is a cross-sectional view taken along line III-III' shown in FIG. 5.

FIG. 7 is a cross-sectional view taken along line II-II' shown in FIG. 5, and FIG. 8 is a cross-sectional view taken along line III-III' shown in FIG. 5.

For convenience of description, detailed elements of the thin film transistor layer 210 will be omitted or may be brief in FIGS. 7 and 8, and FIGS. 7 and 8 illustrate a TFT substrate 300 that the detailed elements of the thin film transistor layer 210.

Referring to FIGS. 7 and 8, the organic light emitting diode 380, the encapsulation film 390 and the protective film 240 are formed on the TFT substrate 300.

The encapsulation film 390 is formed to cover the organic light emitting diode 380 formed on the display area DA, thereby preventing $H_2O$ and $O_2$ from being permeated into the organic light emitting diode 380. At this time, the encapsulation film 390 may include at least one inorganic film and at least one organic film. For example, the encapsulation film 390 may include a first inorganic film 391, an organic film 392, and a second inorganic film 393. In this case, the first inorganic film 391 is formed to cover the second electrode 383. The organic film 392 is formed on the first inorganic film 391, and the second inorganic film 393 is formed to cover the organic film 392.

Each of the first and second inorganic films 391 and 393 may be formed of a silicon nitride, an aluminum nitride, a zirconium nitride, a titanium nitride, a hafnium nitride, a tantalum nitride, silicon oxide, an aluminum oxide, or a titanium oxide. The first and second inorganic films 391 and 393 may be deposited by, but not limited to, a chemical vapor deposition (CVD) method or atomic layer deposition (ALD) method.

The organic film 392 may be formed transparently to transmit light emitted from the organic light emitting layer 382. The organic film 392 may be formed of an organic material, which may transmit light emitted from the organic light emitting layer 382 at 95% or more, for example, acrylic resin, epoxy resin, phenolic resin, polyamide resin, or polyimide resin. The organic film 392 may be formed by, but not limited to, vapor deposition, printing or slit coating method, which uses organic matters. The organic film 392 may be formed by an ink-jet process.

The protective film 240 covers the encapsulation film 390 to protect the organic light emitting diode 380 and the encapsulation film 390 formed on the first substrate 111 while the first substrate 111 is moving to the place where the later process is performed. The protective film 240 is formed even on the non-display area NDA as well as the display area DA to cover the encapsulation film 390, and may not be formed on the pad area PA of the non-display area NDA as shown in FIG. 8.

The protective film 240 includes the substrate layer 242 and the adhesive layer 244, and the substrate layer 242 and the encapsulation film 390 are adhered to each other by the adhesive layer 244.

The adhesive layer 244 is formed at the edge area of the substrate layer 242, and is not formed at the center area of the substrate layer 242. At this time, the edge area of the substrate layer 242 provided with the adhesive layer 244 is overlapped with the non-display area, and may partially be overlapped with the display area DA. However, even though the adhesive layer 244 is partially overlapped with the display area DA, the adhesive layer 244 is not formed to be overlapped with the second electrode 383 of the organic light emitting diode 380. In this way, since the adhesive layer 244 is formed at the edge area of the substrate layer 242 but is not formed on the second electrode 383, the encapsulation film 390 of the area where the second electrode 383 is formed is not adhered with the substrate layer 242. At this time, since an air gap is formed between the encapsulation film 390 and the substrate layer 242, adhesion between the encapsulation film 390 and the substrate layer 242 is close to 0 gf/inch.

Meanwhile, adhesion between the adhesive layer 244 and the encapsulation film 390 may be greater than that between the second electrode 383 and the organic light emitting layer 382 of the organic light emitting diode 380. The protective film 240 should not be separated from the first substrate 111 on which the organic light emitting diode 380 and the encapsulation film 390 are formed while the first substrate 111 is moving to the place where the later process is performed. To make sure of it, adhesion between the adhesive layer 244 and the encapsulation film 390 should be greater than that between the second electrode 383 and the organic light emitting layer 382 of the organic light emitting diode 380. Since the adhesive layer 244 is not overlapped with the second electrode 383, even though the adhesion between the adhesive layer 244 and the encapsulation film 390 is greater than that between the second electrode 383 and the organic light emitting layer 382, a gap between the second electrode 383 and the organic light emitting layer 382 is not generated when the protective film 240 is removed.

In the first embodiment of the present invention, the adhesive layer 244 is formed at the edge area only of the substrate layer 242 and is formed so as not to be overlapped with the second electrode 383, whereby the second electrode 383 may be prevented from being separated from the organic light emitting layer 382 when the protective film 240 is removed.

Although FIG. 5 shows that the adhesive layer 244 is overlapped with a part of the display area DA, the present invention is not limited to the example of FIG. 5. In another embodiment, the adhesive layer 244 may not be overlapped with the display area DA. For example, if the second electrode 383 is formed to be extended to the non-display area NDA, the adhesive layer 244 may not be overlapped with the display area DA. At this time, the adhesive layer 244 may be formed to be overlapped with a part of the non-display area NDA and at the same time so as not to be overlapped with the second electrode 383.

Although FIG. 5 shows that the adhesive layer 244 is not formed on the pad area PA, the present invention is not limited to the example of FIG. 5. In another embodiment, the adhesive layer 244 may be formed on the non-display area NDA including the pad area as shown in FIG. 9.

Also, although FIG. 5 shows that the adhesive layer 244 is formed at four edge areas of the substrate layer 242, the present invention is not limited to the example of FIG. 5. In another embodiment, the adhesive layer 244 may be formed at only two edge areas of the substrate layer 242, which face each other, as shown in FIG. 10.

Second Embodiment

Figure 11:
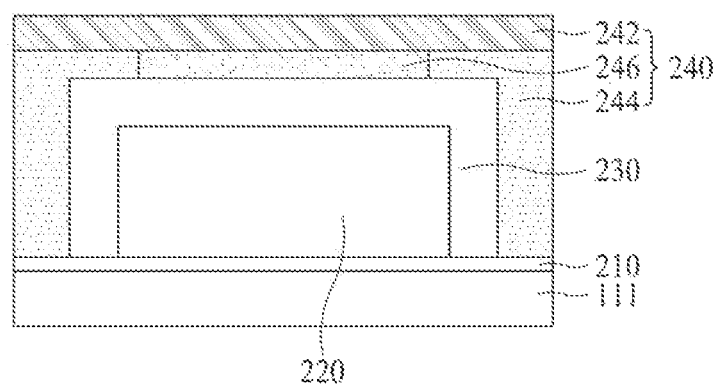
FIG. 11 is a cross-sectional view briefly illustrating a first substrate according to a second embodiment of the present invention.

FIG. 11 is a cross-sectional view briefly illustrating a display device including a first substrate 111 according to the second embodiment of the present invention.

The first substrate 111 for moving to a place where a later process is performed before being bonded to a second substrate 112 is shown in FIG. 11. Since a thin film transistor layer 210, an organic light emitting diode layer 220, and an encapsulation layer 230, which are shown in FIG. 11, are substantially the same as those shown in FIGS. 5 to 8, their detailed description will be omitted.

A protective film 240 is formed on the encapsulation layer 230. The protective film 240 includes a substrate layer 242, a first adhesive layer 244, and a second adhesive layer 246. The protective film 240 serves to prevent particles from being permeated into the thin film transistor layer 210, the organic light emitting diode layer 220 and the encapsulation layer 230 formed on the first substrate 111 or prevent the thin film transistor layer 210, the organic light emitting diode layer 220 and the encapsulation layer 230 from being damaged while the first substrate 111 is moving to perform the later process. The protective film 240 is attached onto the encapsulation layer 230 before the first substrate 111 moves to the place where the later process is performed, and then separated from the encapsulation layer 230 before the later process is performed.

Hereinafter, a structure of the protective film 240 according to the second embodiment of the present invention will be described with reference to FIGS. 12 to 13.

Figure 12:
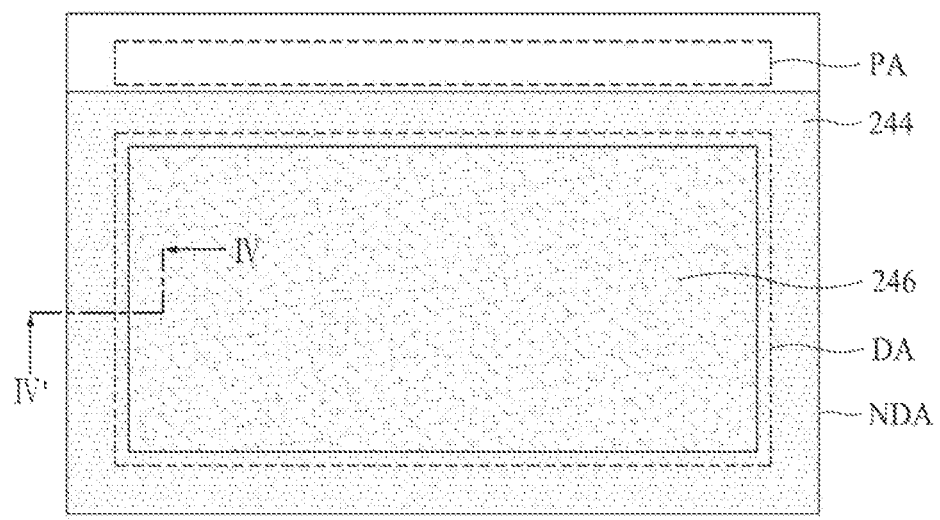
FIG. 12 is a plane view briefly illustrating a first substrate according to the second embodiment of the present invention.

FIG. 12 is a plane view briefly illustrating a first substrate according to the second embodiment of the present invention.

Referring to FIG. 12, the first substrate 111 is categorized into a display area DA and a non-display area NDA, wherein a pad area PA where pads are formed may be formed on the non-display area NDA.

Pixels P for displaying an image are formed on the display area DA. Each of the pixels may include an organic light emitting diode that includes a thin film transistor, a first electrode, an organic light emitting layer, and a second electrode. Each of the pixels supplies a predetermined current to the organic light emitting diode in accordance with the data voltage of the data line if the gate signal is input from the gate line by using the thin film transistor. For this reason, the organic light emitting diode of each of the pixels may emit light with a predetermined brightness in accordance with the predetermined current.

The pad area PA may be arranged at an edge of one side of the first substrate 111. The pad area PA includes a plurality of pads, which may electrically be connected with lines of the flexible film 150 by using an anisotropic conducting film.

The protective film 240 is adhered on the display area DA and the non-display area NDA. At this time, the protective film 240 may not be formed on the pad area PA as shown in FIG. 12. However, the present invention is not limited to the example of FIG. 12. In another embodiment, the protective film 240 may be formed even on the pad area PA.

The protective film 240 includes a substrate layer 242, a first adhesive layer 244 and a second adhesive layer 246. The second embodiment of the present invention is characterized in that the first adhesive layer 244 is formed on the edge area of the substrate layer 242 and the second adhesive layer 246 is formed at the center area of the substrate layer 242.

Hereinafter, the protective film 240 according to the second embodiment of the present invention will be described in more detail with reference to FIG. 13.

Figure 13:
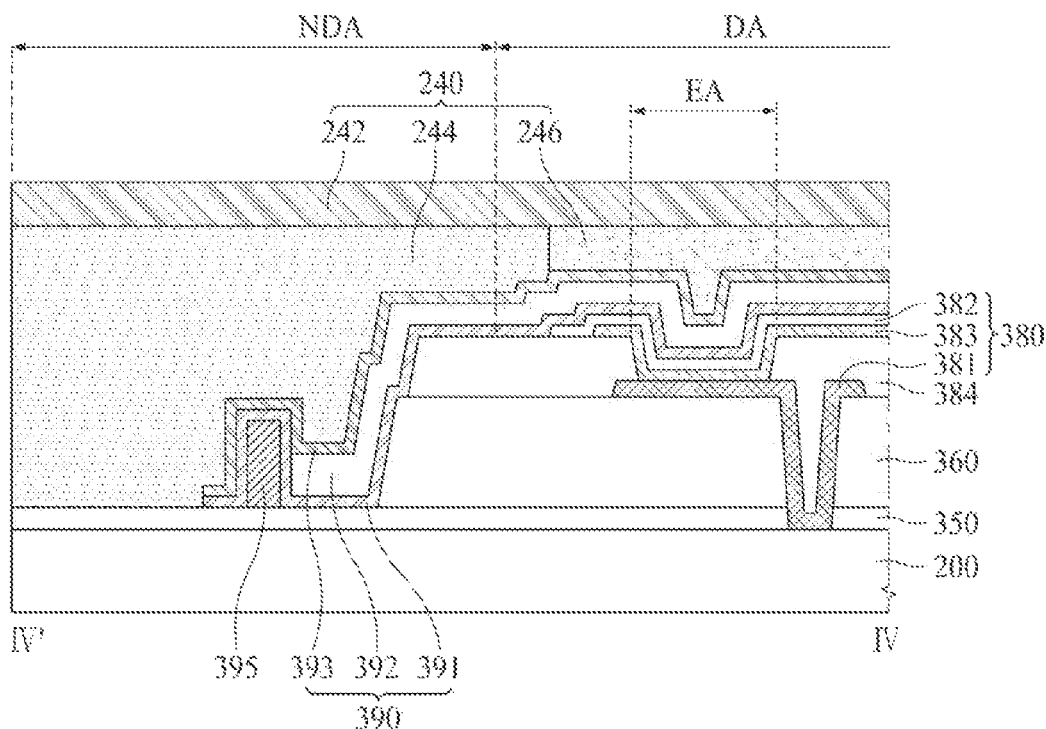
FIG. 13 is a cross-sectional view taken along line IV-IV' shown in FIG. 12.

FIG. 13 is a cross-sectional view taken along line IV-IV' shown in FIG. 12.

For convenience of description, detailed elements of the thin film transistor layer 210 will be omitted in FIG. 13, and FIG. 13 illustrates a TFT substrate 300 that the detailed elements of the thin film transistor layer 210.

Referring to FIG. 13, an organic light emitting diode 380, an encapsulation film 390 and a protective film 240 are formed on the TFT substrate 300. Since the organic light emitting diode 380 and the encapsulation film 390, which are shown in FIG. 13, are substantially the same as those shown in FIGS. 5 to 8, their detailed description will be omitted.

The protective film 240 covers the encapsulation film 390 to protect the organic light emitting diode 380 and the encapsulation film 390 formed on the first substrate 11 while the first substrate 111 is moving to the place where the later process is performed. The protective film 240 is formed even on the non-display area NDA as well as the display area DA to cover the encapsulation film 390, and may not be formed on the pad area PA of the non-display area NDA.

The protective film 240 includes the substrate layer 242, the first adhesive layer 244 and the second adhesive layer 246, and the substrate layer 242 and the encapsulation film 390 are adhered to each other by the first adhesive layer 244 and the second adhesive layer 246.

The first adhesive layer 244 is formed at the edge area of the substrate layer 242, and is not formed at the center area of the substrate layer 242. At this time, the edge area of the substrate layer 242 provided with the first adhesive layer 244 is overlapped with the non-display area NDA, and may partially be overlapped with the display area DA. However, even though the first adhesive layer 244 is partially overlapped with the display area DA, the first adhesive layer 244 is not formed to be overlapped with the second electrode 383 of the organic light emitting diode 380.

The second adhesive layer 246 is formed at the center area of the substrate layer 242. The second adhesive layer 246 is overlapped with the display area DA, and may be overlapped with the second electrode 383 formed on the display area DA.

The second adhesive layer 246 has adhesion smaller than that of the first adhesive layer 244. Since the second adhesive layer 246 is overlapped with the second electrode 383, if its adhesion is great, a problem occurs in that the second electrode 383 is separated from the organic light emitting layer 382 by adhesion of the second adhesive layer 246 when the protective film 240 is removed. On the other hand, since the first adhesive layer 244 is not overlapped with the second electrode 383, the first adhesive layer 244 may have adhesion greater than that of the second adhesive layer 244. Adhesion between the first adhesive layer 244 and the encapsulation film 390 may be greater than that between the second electrode 383 and the organic light emitting layer 382.

Meanwhile, to solve the problem that the second electrode 383 is separated from the organic light emitting layer 382 when the protective film 240 is removed, adhesion between the second adhesive layer 246 and the encapsulation film 390 should be smaller than that between the second electrode 383 and the organic light emitting layer 382.

Figure 14:
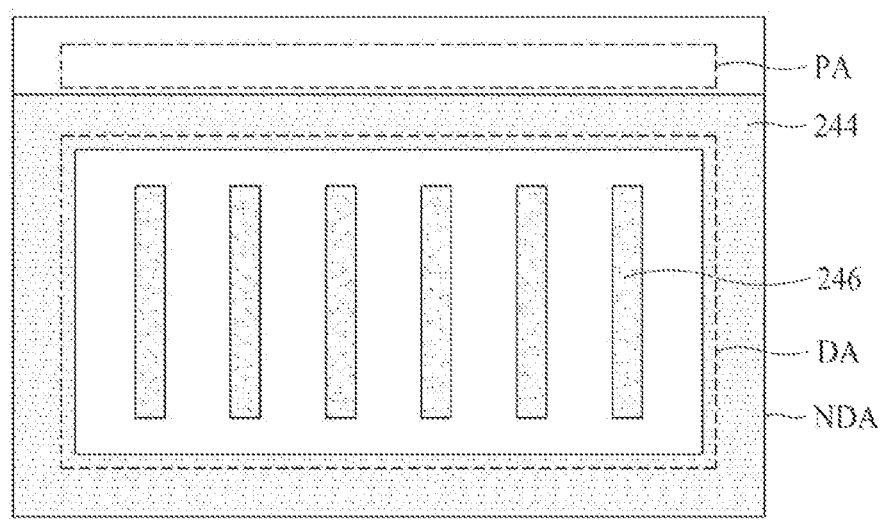
FIG. 14 is a plane view illustrating a modified embodiment of FIG. 12.

Also, although FIG. 12 shows that the second adhesive layer 246 is formed on the entire surface of the center area surrounded by the first adhesive layer 244, the present invention is not limited to the example of FIG. 12. The second adhesive layer 246 may be formed of a plurality of patterns as shown in FIG. 14. In this case, the adhesion between the second adhesive layer 246 and the encapsulation film 390 is dispersed, a force for pulling the second electrode 383 per unit area when the protective film 240 is removed may be reduced.

In the second embodiment of the present invention, the adhesion between the second adhesive layer 246 and the encapsulation film 390 is smaller than that between the second electrode 383 and the organic light emitting layer 382, whereby the second electrode 383 may be prevented from being separated from the organic light emitting layer 382 when the protective film 240 is removed.

Also, in the second embodiment of the present invention, the second adhesive layer 246 is formed of a plurality of patterns, whereby the adhesion of the second adhesive layer 246 may be dispersed. Therefore, since the force for pulling the second electrode 383 per unit area when the protective film 240 is removed may be reduced, the second electrode 383 may more effectively be prevented from being separated from the organic light emitting layer 382.

Also, in the second embodiment of the present invention, since the adhesion of the first adhesive layer 244 is greater than that of the second adhesive layer 246, the protective film 240 may be prevented from being separated from the first substrate 111 while the first substrate 111 is moving to the place where the later process is performed.

Although FIG. 12 shows that the first adhesive layer 244 is overlapped with a part of the display area DA, the present invention is not limited to the example of FIG. 12. In another embodiment, the first adhesive layer 244 may not be overlapped with the display area DA. For example, if the second electrode 383 is formed to be extended to the non-display area NDA, the first adhesive layer 244 may not be overlapped with the display area DA. At this time, the first adhesive layer 244 may be formed to be overlapped with a part of the non-display area NDA and at the same time so as not to be overlapped with the second electrode 383.

Although FIG. 12 shows that the first adhesive layer 244 is not formed on the pad area PA, the present invention is not limited to the example of FIG. 12. In another embodiment, the first adhesive layer 244 may be formed on the non-display area NDA including the pad area.

Also, although FIG. 12 shows that the first adhesive layer 244 is formed at four edge areas of the substrate layer 242, the present invention is not limited to the example of FIG. 12. In another embodiment, the first adhesive layer 244 may be formed at only two edge areas of the substrate layer 242, which face each other.

Figure 16A:
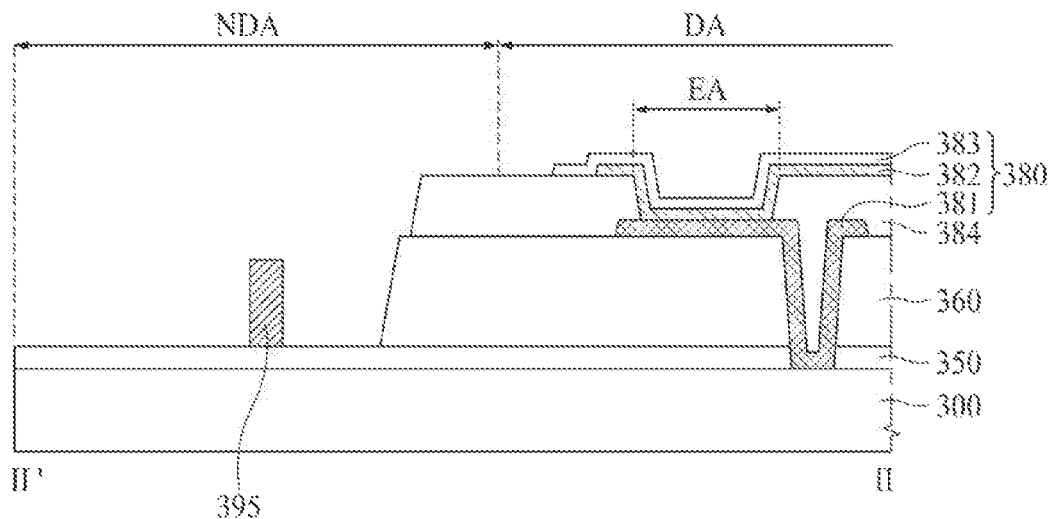
FIGS. 16A to 16E are cross-sectional views illustrating a method for manufacturing a display device according to the first embodiment of the present invention.

As shown in FIG. 16A, the pixels are formed on the display area DA of the TFT substrate 300 provided with the thin film transistor layer shown in FIG. 6. In more detail, referring to FIG. 6, a buffer film is formed on the first substrate 111. The buffer film may be formed of an inorganic film, for example, a silicon oxide film, a silicon nitride film or a multi-layered film of the silicon oxide film and the silicon nitride film.

Figure 15:
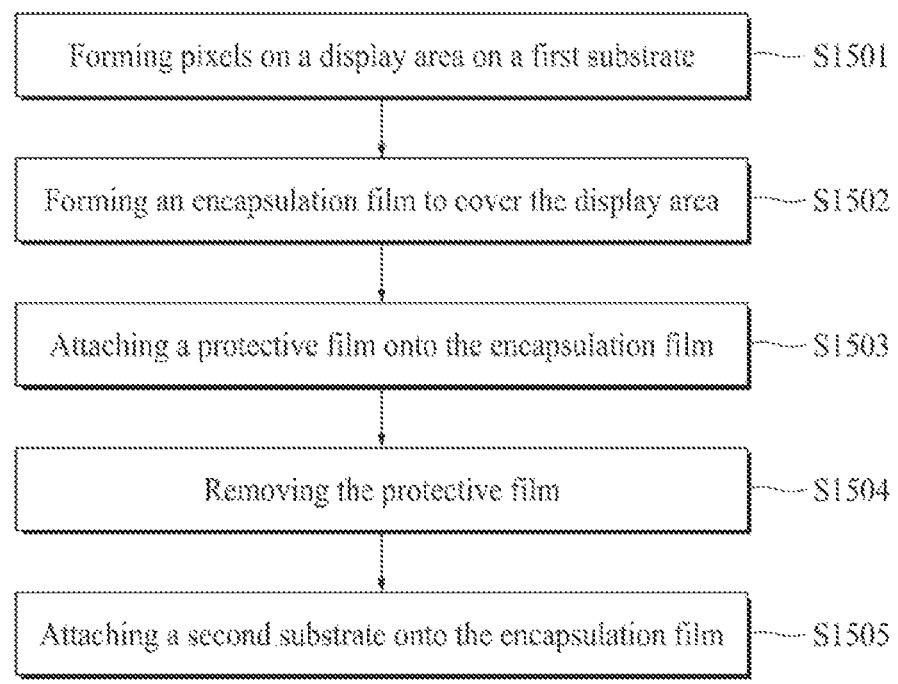
FIG. 15 is a flow chart illustrating a method for manufacturing a display device according to the first embodiment of the present invention.

First of all, pixels P are formed on a display area DA (S1501 of FIG. 15).

As shown in FIG. 16A, the pixels P are formed on the display area DA of the first substrate 111. In more detail, a buffer film is formed on the first substrate 111. The buffer film may be formed of an inorganic film, for example, a silicon oxide film, a silicon nitride film or a multi-layered film of the silicon oxide film and the silicon nitride film.

Then, an active layer 311 is formed on the buffer film. The active layer 311 may be formed of a silicon based semiconductor material or an oxide based semiconductor material.

Then, a gate insulating film 330 is formed on the active layer 311. The gate insulating film 330 may be formed of an inorganic film, for example, a silicon oxide film, a silicon nitride film or a multi-layered film of the silicon oxide film and the silicon nitride film.

A gate electrode 312 and a lower electrode 321 of a capacitor 320 are formed on the gate insulating film 330. Each of the gate electrode 312 and the lower electrode 321 may be, but not limited to, a single layer or multi-layer comprised of any one of Mo, Al, Cr, Au, Ti, Ni, Nd and Cu or their alloy.

Then, an inter-layer dielectric layer 340 is formed on the gate electrode 312 and the lower electrode 321. The inter-layer dielectric layer 340 may be formed of an inorganic film, for example, a silicon oxide film, a silicon nitride film, or a multi-layered film of the silicon oxide film and the silicon nitride film.

Then, contact holes CH1 and CH2 for exposing the active layer 312 are formed to pass through the gate insulating film 330 and the inter-layer dielectric layer 340.

Then, a source electrode 313, a drain electrode 314, and an upper electrode 322 of the capacitor 320 are formed on the inter-layer dielectric layer 340. Each of the source electrode 313, the drain electrode 314 and the upper electrode 322 may be, but not limited to, a single layer or multi-layer comprised of any one of Mo, Al, Cr, Au, Ti, Ni, Nd and Cu or their alloy.

Then, a passivation film 350 is formed on the thin film transistor 310 and the capacitor 320. The passivation film 350 may serve as an insulating film. The passivation film 350 may be formed of an inorganic film, for example, a silicon oxide film, a silicon nitride film, or a multi-layered film of the silicon oxide film and the silicon nitride film.

Then, a planarization film 360 is formed on the passivation film 350. The planarization film 360 may be formed of an organic film such as acrylic resin, epoxy resin, phenolic resin, polyamide resin, and polyimide resin.

Then, a contact hole CH3 for exposing the source or drain electrode of the thin film transistor 310 is formed to pass through the passivation film 350 and the planarization film 360, and a first electrode 381 is formed. The first electrode 381 may be formed of a metal material having high reflectivity such as a deposition structure (Ti/Al/Ti) of Al and Ti, a deposition structure (ITO/Al/ITO) of Al and ITO, an APC alloy, and a deposition structure (ITO/APC/ITO) of APC alloy and ITO. The APC alloy is an alloy of Ag, Pd and Cu.

Then, a bank 384 is formed on the planarization film 360 to cover an edge of the first electrode 381, thereby partitioning emission areas EA. The bank 384 may be formed of an organic film such as acrylic resin, epoxy resin, phenolic resin, polyamide resin, and polyimide resin.

Then, an organic light emitting layer 382 is formed on the first electrode 381 and the bank 384. A second electrode 383 is formed on the organic light emitting layer 382. The second electrode 383 may be formed of a transparent conductive material (TCO) such as ITO and IZO, which may transmit light, or a semi-transmissive conductive material such as Mg, Ag, or alloy of Mg and Ag. A capping layer may be formed on the second electrode 383.

Meanwhile, a dam 295 may further be formed on the non-display area NDA. The dam 295 may be formed simultaneously with the planarization film 360 or the bank 384. The dam 295 may be formed of an organic film such as acrylic resin, epoxy resin, phenolic resin, polyamide resin, and polyimide resin.

Next, an encapsulation film 390 is formed to cover the display area DA (S1502 of FIG. 15).

Figure 16B:
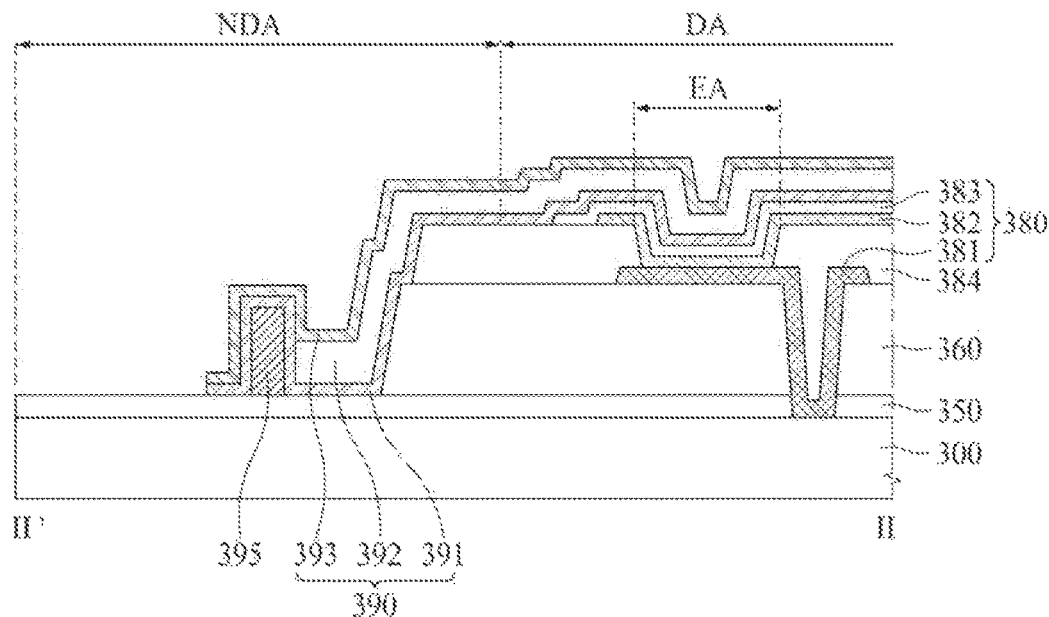

As shown in FIG. 16B, the encapsulation film 390 is formed on the second electrode 390. In more detail, a first inorganic film 391 is formed to cover the display area DA. At this time, the first inorganic film 391 is formed using a CVD method or an ALD method. The first inorganic film 391 may be formed of a silicon nitride, an aluminum nitride, a zirconium nitride, a titanium nitride, a hafnium nitride, a tantalum nitride, silicon oxide, an aluminum oxide, or a titanium oxide.

Then, an organic film 392 is formed to cover the first inorganic film 391. The organic film 392 may be formed of an organic material, which may transmit light emitted from the organic light emitting layer 382 at 99% or more, for example, acrylic resin, epoxy resin, phenolic resin, polyamide resin, or polyimide resin.

Then, a second inorganic film 393 is formed to cover the organic film 392. The second inorganic film 393 may be formed of a silicon nitride, an aluminum nitride, a zirconium nitride, a titanium nitride, a hafnium nitride, a tantalum nitride, silicon oxide, an aluminum oxide, or a titanium oxide.

Next, a protective film 240 is formed on the encapsulation film 390 (S1503 of FIG. 15).

Figure 16C:
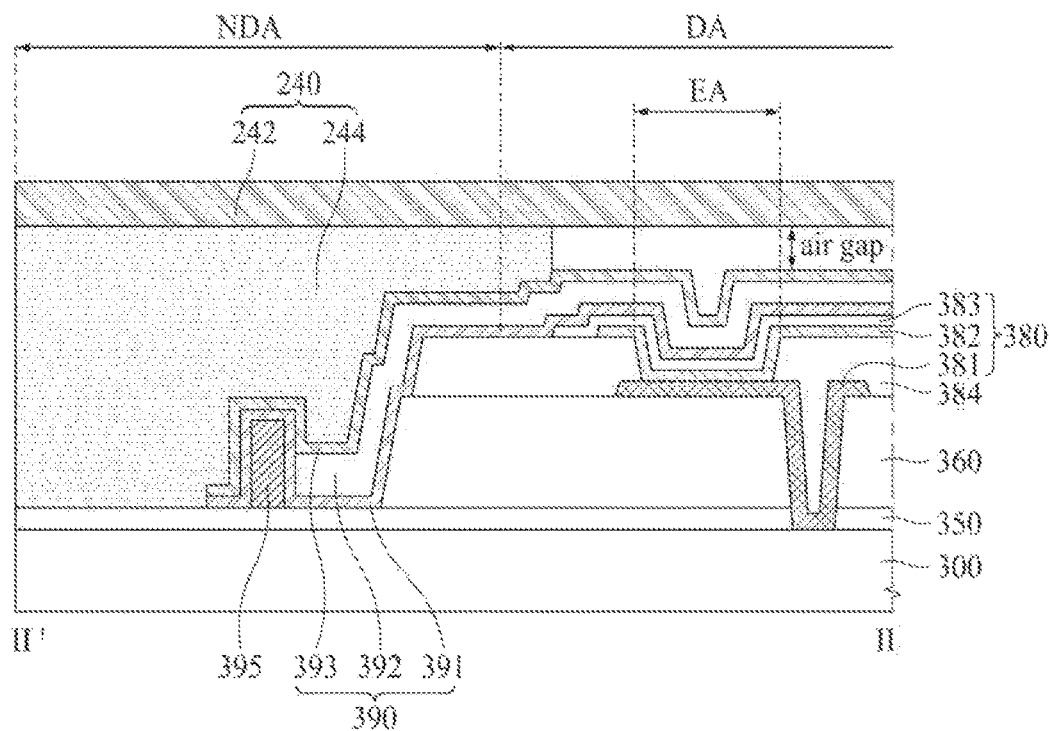

As shown in FIG. 16C, the protective film 240 is attached onto the encapsulation film 390. The protective film 240 includes a substrate layer 242 and a first adhesive layer 244. The first adhesive layer 244 is formed at the edge area of the substrate layer 242 and then overlapped with the non-display area NDA of the first substrate 111. Also, the first adhesive layer 244 may be overlapped with a part of the display area DA of the first substrate 111 but is not overlapped with the second electrode 383. The first adhesive layer 244 may be an adhesive resin, and its adhesion may be greater than adhesion between the second electrode 383 and the organic light emitting layer 382.

In addition, the protective film 240 may further include a second adhesive layer 246 (e.g., see FIG. 11) formed on at the center area of the substrate layer 242. The second adhesive layer 246 may be overlapped with the second electrode 383 unlike the first adhesive layer 244, and its adhesion may be smaller than adhesion between the second electrode 383 and the organic light emitting layer 382. Also, the second adhesive layer 246 may be formed on the entire center area of the substrate layer 242, or may be formed of a plurality of patterns at the center area of the substrate layer 242.

Next, the protective film 240 is removed (S1504 of FIG. 15).

Figure 16D:
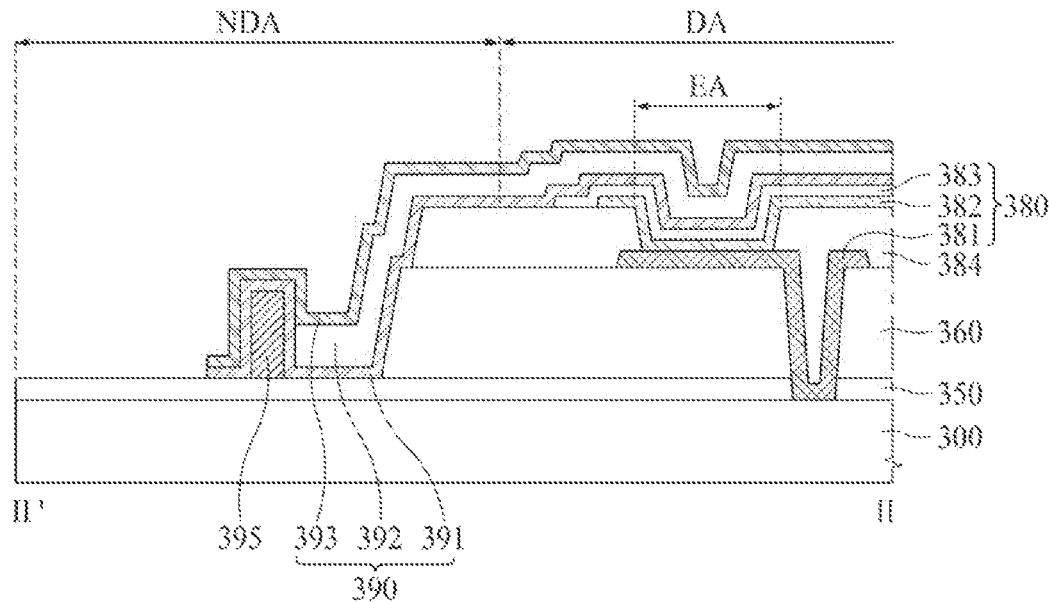

As shown in FIG. 16D, the protective film 240 is removed. In more detail, the first substrate 111 provided with the organic light emitting diode 380 and the encapsulation film 390 moves to a place where a later process is performed in a state that the protective film 240 is attached thereonto. Then, the protective film 240 is removed from the first substrate 111 before the later process is performed.

Next, the first substrate 111 and the second substrate 112 are bonded to each other (S1505 of FIG. 15).

Figure 16E:
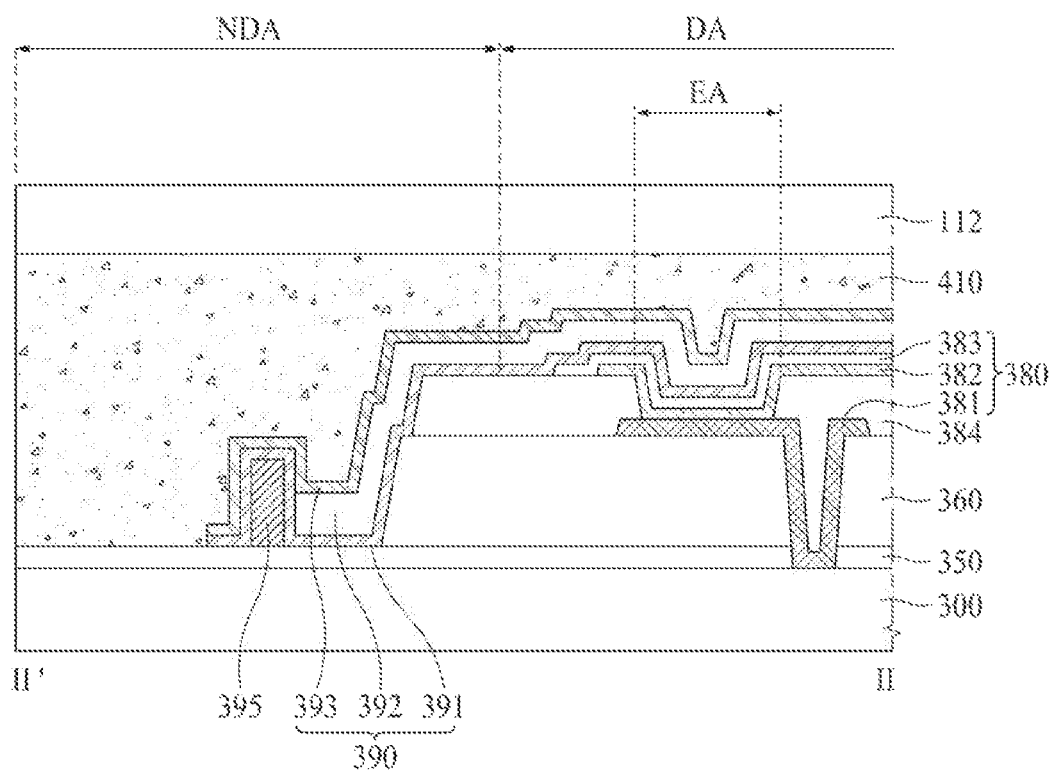

As shown in FIG. 16E, the second substrate 112 is bonded to the first substrate 111 from which the protective film 240 is removed. Although not shown in detail, first to third color filters and a black matrix may be formed on the second substrate 112. A red color filter may be formed on a red emission portion, a blue color filter may be formed on a blue emission portion, and a green color filter may be formed on a green emission portion. In this case, the encapsulation film 390 of the first substrate 111 and is adhered to the color filters of the second substrate 112 by an adhesive layer 410, whereby the first substrate 111 and the second substrate 112 may be bonded to each other. At this time, the adhesive layer 410 may be formed on all areas where the first substrate 111 and the second substrate 112 are overlapped with each other, and its adhesion may be greater than adhesion between the second electrode 383 and the organic light emitting layer 382.

Otherwise, the first to third color filters and the black matrix may directly be formed on the encapsulation film 390 of the first substrate 111 from which the protective film 240 is removed, through the later process. In this case, the color filters of the first substrate 111 may be adhered to the second substrate 112 by the adhesive layer 410.

Otherwise, a touch panel may be formed on the second substrate 112. At this time, the touch panel may be provided with a first touch electrode and a second touch electrode. In this case, the encapsulation film 390 of the first substrate 111 may be adhered to the touch panel of the second substrate 112 by the adhesive layer 410.

Otherwise, the second touch electrode may only be formed on the second substrate 112. The first touch electrode may directly be formed on the encapsulation film 390 of the first substrate 111 from which the protective film 240 is removed, through the later process. In this case, the first substrate 111 provided with the first touch electrode may be adhered to the second substrate 112 provided with the second touch electrode by the adhesive layer 410.

Otherwise, a polarizer may be formed on the second substrate 112. In this case, the encapsulation film 390 of the first substrate 111 may be adhered to the polarizer of the second substrate 112 by the adhesive layer 410.

Meanwhile, although the protective film 240 is attached onto the encapsulation film 390 and then removed in FIGS. 15 and 16, the present invention is not limited to the examples of FIGS. 15 and 16. In another embodiment, electrode patterns, for example, the first touch electrode and the second touch electrode may further be formed on the encapsulation film 390. In this case, the protective film 240 may be attached onto the electrode patterns and then removed therefrom after the first substrate moves to the place where the later process is performed.

As described above, according to one or more embodiments of the present invention, the following advantages can be obtained.

The first substrate provided with the organic light emitting diode and the encapsulation film moves to the place where the later process is performed in a state that the protective film is attached onto the encapsulation film, whereby particles may be prevented from being permeated into the organic light emitting diode and the encapsulation film or the organic light emitting diode and the encapsulation film may be prevented from being damaged while the first substrate is moving to the place where the later process is performed.

Also, the first adhesive layer for adhering the protective film to the encapsulation film is formed at only the edge area and formed so as not to be overlapped with the second electrode, whereby the second electrode may be prevented from being separated from the organic light emitting layer when the protective film is removed from the place where the later process is performed. Therefore, yield and reliability of the display device may be improved.

Also, the second adhesive layer for adhering the protective film to the encapsulation film is formed to be overlapped with the second electrode and its adhesion is smaller than the adhesion between the second electrode and the organic light emitting layer, whereby the second electrode may be prevented from being separated from the organic light emitting layer when the protective film is removed from the place where the later process is performed.

Also, the second adhesive layer is formed of a plurality of patterns, whereby the adhesion of the second adhesive layer may be dispersed. Therefore, since the force for pulling the second electrode per unit area when the protective film is removed may be reduced, the second electrode may more effectively be prevented from being separated from the organic light emitting layer.

Also, since the adhesion of the first adhesive layer is greater than the adhesion between the second electrode and the organic light emitting layer, the protective film may be prevented from being separated from the first substrate while the first substrate is moving to the place where the later process is performed.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents. Thus, the above embodiments are to be considered in all respects as illustrative and not restrictive. The scope of the invention should be determined by reasonable interpretation of the appended claims and all change which comes within the equivalent scope of the invention are included in the scope of the invention.

What is claimed is:

1. A method for manufacturing a display device, the method comprising:
    forming pixels on a display area on a first substrate;
    forming an encapsulation film to cover the display area;
    attaching a protective film onto the encapsulation film, wherein the protective film includes a substrate layer and a first adhesive layer formed at an edge area of at least one side of the substrate layer;
    removing the protective film; and
    attaching a second substrate onto the encapsulation film by using a third adhesive layer after removing the protective film.

2. The method of claim 1, wherein the edge area of at least one side of the substrate layer is overlapped with a non-display area surrounding the display area.

3. The method of claim 1, wherein in the attaching of the protective film, the protective film further includes an air gap formed at a center area of the substrate layer, the air gap being formed between the substrate layer and the encapsulation film.

4. The method of claim 1, wherein the first adhesive layer contacts at least part of an upper surface of the encapsulation film and a side surface of the encapsulation film.

5. A method for manufacturing a display device, the method comprising:
    forming pixels on a display area on a first substrate;
    forming an encapsulation film to cover the display area;
    attaching a protective film onto the encapsulation film, wherein the protective film includes a substrate layer and a first adhesive layer formed at an edge area of at least one side of the substrate layer; and
    removing the protective film,
    wherein each of the pixels includes a first electrode, an organic light emitting layer arranged on the first electrode, and a second electrode arranged on the organic light emitting layer, and
    wherein a horizontal projection of the first adhesive layer is not overlapped with a horizontal projection of the second electrode.

6. The method of claim 5, wherein adhesion between the encapsulation film and the first adhesive layer is greater than adhesion between the second electrode and the organic light emitting layer.

7. A method for manufacturing a display device, the method comprising:
- forming pixels on a display area on a first substrate;
- forming an encapsulation film to cover the display area;
- attaching a protective film onto the encapsulation film, wherein the protective film includes a substrate layer and a first adhesive layer formed at an edge area of at least one side of the substrate layer; and
- removing the protective film,
- wherein in the attaching of the protective film, the protective film further includes a second adhesive layer formed at a center area of the substrate layer.

\* \* \* \* \*